United States Patent [19]
Gundjian et al.

[11] Patent Number: 5,047,645
[45] Date of Patent: Sep. 10, 1991

[54] THIN FILM INFRARED LASER DETECTOR AND MONITOR

[75] Inventors: Arshavir A. Gundjian, Montreal; Massoud Badaye, Gloucester, both of Canada

[73] Assignee: The Royal Institution for the Advancement of Learning, Montreal, Canada

[21] Appl. No.: 376,741

[22] Filed: Jul. 7, 1989

[51] Int. Cl.$^5$ .............................. G01J 5/20; G01S 5/22
[52] U.S. Cl. .......................... 250/370.01; 250/370.12; 250/336.1; 250/371; 250/338.4
[58] Field of Search .......... 357/60; 250/338.4, 370.01, 250/336.1, 370.12, 371

[56] References Cited

U.S. PATENT DOCUMENTS

| | | | |
|---|---|---|---|
| 3,887,937 | 6/1975 | Gatos et al. | 357/26 |
| 3,952,323 | 4/1976 | Tanimura et al. | 357/60 X |
| 4,872,046 | 10/1989 | Morkoc et al. | 357/60 |

FOREIGN PATENT DOCUMENTS 55-144576  11/1980  Japan .............................. 250/370.01

OTHER PUBLICATIONS

Ribakovs et al., $CO_2$ *Pulsed Laser Radiation Tellurium Detectors*, IEEE Journal of Quantum Electronics, vol. QE-14, No. 1, Jan. 78, pp. 42-44.

*Primary Examiner*—Constantine Hannaher
*Assistant Examiner*—Jacob M. Eisenberg
*Attorney, Agent, or Firm*—Bachman & LaPointe

[57] ABSTRACT

A detecting or monitoring device for laser radiation is able to oeprate at room temperature and employs a thin film of semi-conductor material of non-centrosymmetric lattice structure having a substantial crystallographic texture; thin film may suitably be tellurium in a film thickness of 1 to 100 μm, supported on a substrate of single crystal silicon.

21 Claims, 10 Drawing Sheets

THIN FILM INFRARED LASER DETECTOR AND MONITOR

BACKGROUND OF THE INVENTION i) Field of the Invention

This invention relates to the detection and monitoring of laser radiation, as well as to devices and apparatus for such detection and monitoring.

ii) Description of Prior Art

Laser radiation is produced in transitions between energy levels in atoms and molecules as a result of stimulated emission following the interaction between light and such energy levels. For this to occur the atom or molecule must be in an excited energy level and have a vacant lower energy level. If the photon energy of incident light approximates the energy difference between the excited and lower levels, a transition is stimulated and the stored energy of the atom or molecule is emitted as laser light or radiation which has characteristics which distinguish it from light emitted by conventional sources. In particular laser radiation has a high degree of collimation, a narrow spectral line width, coherence and the ability to focus as a spot.

Laser radiation may be continuous or pulsed and may be produced in gases or solids. The properties of laser radiation have resulted in their use in a variety of applications including material processing such as welding, cutting and drilling; measurement of such parameters as velocity of fluid flow and dimensions; flaw detection and determination of surface finish. Laser radiation is employed in holography, in medical procedures and in optical-fiber communication systems.

The numerous applications of laser radiation require, in general, a precise knowledge of the laser radiation characteristics, for example, pulse height, shape, width and rise and fall times.

Devices have been developed for the detection and monitoring of laser radiation to provide the required information.

Two especially popular laser radiation sources are the $CO_2$ (carbon dioxide) and YAG (neodymium-yttrium-aluminium-garnet) lasers, which are capable of producing pulsed or continuous infrared radiation at respectively 10.6 and 1.06 $\mu$ wavelength.

Due to their importance, pulsed $CO_2$ laser detectors have been developed and studied extensively, but only three classes of detector have found wide spread use, namely, pyroelectric detectors, photon detectors and photon drag detectors.

Pyroelectric detectors employ heat transfer from the laser radiation to a pyroelectric crystal which causes a change in electric polarization, the corresponding voltage change is a measure of the laser output radiation.

Photon detectors operate on the basis of first order resistivity changes, due to electronic transitions caused by transfer of photon energy to electrons.

Photon drag detectors exploit momentum transfer during interactions between photons and free charge carriers in semi-conductors.

Pyroelectric detectors are limited in their application by their relatively low intrinsic speed of response and in that the piezoelectricity of the active element produces a distorted reproduction of submicrosecond pulses.

Photon detectors are generally limited to operation at low temperatures in the range 4–30° K, so as to avoid saturation problems.

Photon drag detectors have a fundamentally higher speed of response limited by the momentum scattering time. However, the responsivity is several orders of magnitude less than that of pyroelectric detectors.

SUMMARY OF THE INVENTION

It is an object of this invention to provide laser detection and monitoring devices which overcome disadvantages associated with prior devices and which are of relatively simple structure.

It is a further object of this invention to provide an improved method for detecting or monitoring laser radiation.

It is a still further object of this invention to provide an improved apparatus for detecting or monitoring laser radiation.

In accordance with one aspect of the invention a method of detecting laser radiation comprises directing laser radiation to a thin film of semi-conductor material of non-centrosymmetric lattice structure having a substantial crystallographic texture and determining an electrical signal generated in the thin film responsive to the radiation, as a measure of characteristics of the radiation.

When the thin film and a supporting substrate are both transparent to the laser radiation, the apparatus will function as a monitor for the laser radiation during its use.

In another aspect of the invention a detection device for laser radiation comprises a thin film of non-centroysymmetric semi-conductor material having a substantial crystallographic texture, on a surface of a substrate; the thin film being electrically isolated from the substrate.

In still another aspect of the invention there is provided an apparatus for detecting laser radiation which includes a thin film of semi-conductor material having a substantial crystallographic texture and being of non-centrosymmetric lattice structure. A pair of electrical contact elements is in ohmic contact with the film; and a device, for example an oscilloscope, determines an electrical signal induced in the thin film by laser radiation, and for such purpose is in electrical contact with the contact elements.

The invention is concerned with the detection or monitoring of high power laser radiation especially pulsed radiation generally and especially of ($O_2$ and Nd:YAG laser radiation.

BRIEF DESCRIPTION OF THE DRAWINGS

The invention is illustrated in a particular and preferred embodiment by reference to the accompanying drawings, in which.

DESCRIPTION OF PREFERRED EMBODIMENTS WITH REFERENCE TO THE DRAWINGS

Figure 1:
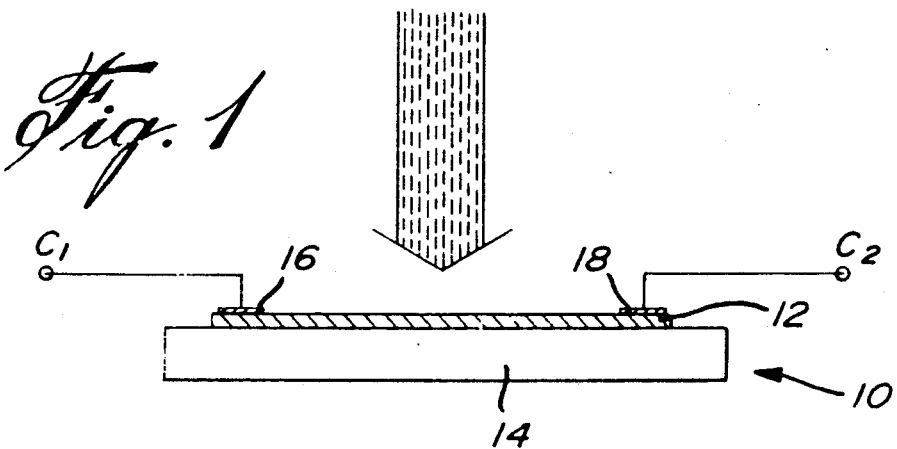
FIG. 1 is a schematic perspective view of a laser detection device of the invention.

With further reference to FIG. 1, a laser detection device 10 comprises a thin film 12 of semi-conductor material on a substrate 14. The necessary characteristics of film 12 and substrate 14 are discussed more fully below.

Electrical contact elements 16 and 18 are in electrical contact with film 12.

Figure 2A:
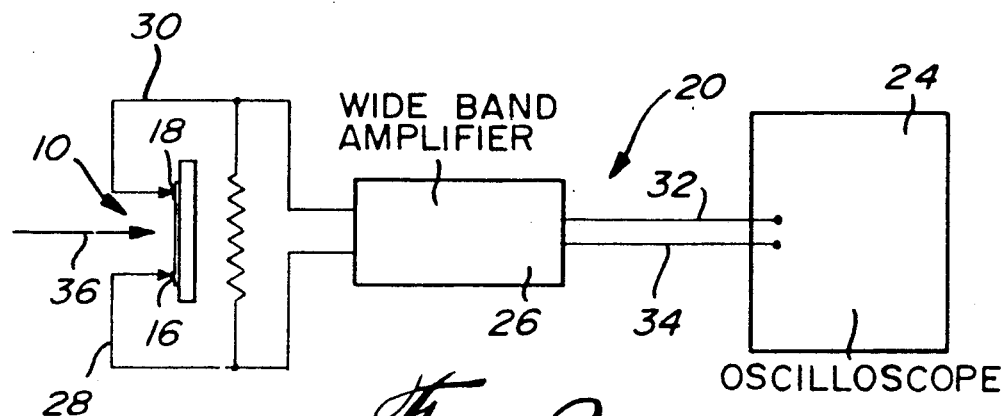
FIG. 2a) is a schematic representation of an apparatus for detecting laser radiation in accordance with the invention employing the device of FIG. 1.
Figure 2B:
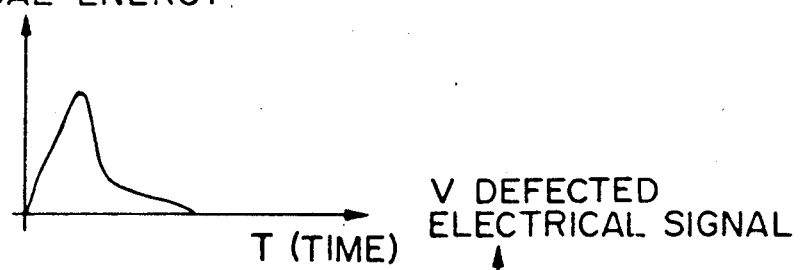
FIG. 2b) and 2c) illustrate schematically the type of graphical plot for optical energy (I) and detected electrical signal (V) with time, obtained with the apparatus of FIG. 2a)
Figure 2C:
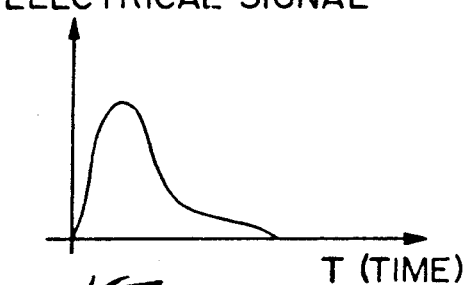

With further reference to FIG. 2, an apparatus 20 for detecting laser radiation comprises laser detection device 10 electrically connected to a signal display system 24.

A wide band amplifier 26 is electrically connected between device 10 and signal display system 24.

Electrical leads 28 and 30 electrically connect electrical contact elements 16 and 18, respectively, with amplifier 26; and electrical leads 32 and 34 electrically connect amplifier 26 with signal display system 24.

In operation laser radiation, for example, in pulse form, from a source 36 is directed at thin film 12 and an electrical signal is produced in film 12 which reproduces the laser pulse optical output, the electrical signal is optionally amplified at amplifier 26 and the signal or amplified signal is displayed at system 24 which typically is an oscilloscope.

If device 10 is fully transparent to the laser radiation, the apparatus 20 will function as a monitor in which case the device 10 is disposed in the path of a working laser radiation. The laser radiation passes through device 10 and continues to its working site. In this way the laser radiation is monitored continuously.

Figure 3:
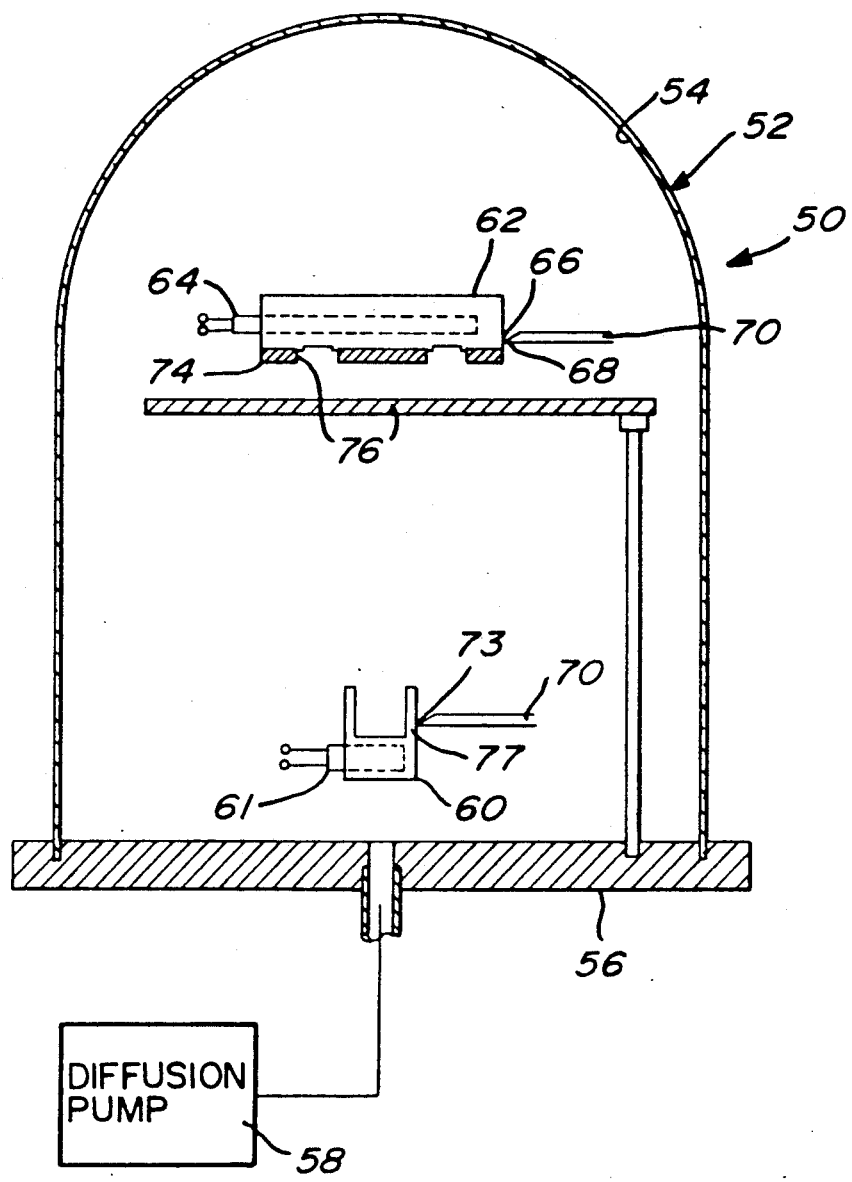
FIG. 3 is a schematic representation of an assembly for producing the device of FIG. 1.

With further reference to FIG. 3, an assembly 50 for the manufacture of device 10 includes an evaporator 52 having a chamber 54 and floor 56; a diffusion pump 58 is capable of providing a vacuum in chamber 54 with a pressure as low as $10^{-5}$ torr.

A crucible 60 is supported in chamber 54 in opposed relationship with a substrate holder 62.

Substrate holder 62 is suitably of high thermal conductivity graphite and houses electric substrate heaters 64; and a thermowell 66 houses a head 68 of a thermocouple 70.

Crucible 60 has a thermowell 72 for a head 73 of thermocouple 70 and includes a crucible heater 61.

A mask 74, suitably of stainless steel supports a plurality of substrates 14 in thermal contact with substrate holder 62.

A plurality of windows 76 in mask 74 define a predetermined shape and area for the thin film 12 to be formed on each substrate 14. The mask 74 may suitably be secured to the substrate holder 62 by screws with the substrates 14 sandwiched therebetween.

Movable shutter 76 is disposed between crucible 60 and mask 74.

In a particular operation, substrates 14 in the form of silicon wafers with polished surfaces were laid on the working surface of the substrate holder 62 with the polished surfaces pointing upwardly. The mask 74 was placed on the substrate holder surface such that it covered everywhere except the working surface of substrates 14 which could be seen through the windows 76. The mask 74 was screwed to the holder 62 and the whole unit was then mounted in chamber 54. Thermocouple heads 68 and 73 were inserted into their respective thermowells 66 and 72.

The system was pumped down to a low pressure of 10 millitorr if possible down to a lower pressure ($10^{-5}$ torr), the substrate heaters 64 were switched on and the chamber 54 was outgassed for a period typically of 1 to 2 hours at temperatures between 200° and 300° C. in different experiments. The substrate temperature was then brought to required level. After stabilization at this new temperature, the crucible heater 61 was turned on with the shutter 76 in the space between crucible 60 and substrate holder 62 in order to avoid any film deposition before source stabilization. When the crucible temperature stabilizes at the set point level the shutter 76 was taken away permitting the deposition of tellurium on the blank substrates 14. After deposition for a predetermined period, the shutter 76 was returned to its original position and the crucible 60 and substrate heaters 64 were turned off. During the whole process the substrate temperature was suitably monitored by an extra thermocouple and a digital voltmeter.

A) Laser Radiation Device a) Thin Film

The thin film 12 of the device 10 is of a semi-conductor material having a non-centrosymmetric lattice structure and exhibiting substantial crystallographic texture. By substantial crystallographic texture is meant that the crystals or crystallites in the film show distinct preferred orientations. Ideally the film should mimic or display a single crystal structure; in so far as such condition is difficult to attain in practice, the film should be formed with as high a degree of preferential orientation as can be obtained.

It is found that the responsivity of the device improves as the density of highly oriented crystals increases.

Suitable semi-conductor materials for the thin film include tellurium, gallium phosphide and gallium arsenide; with tellurium being especially preferred; the films suitably have a thickness of 1 to 100 μm, generally 1 to 50 μm, and preferably 2 to 7 μm, most preferably 5 μm. The crystalline tellurium is a p-type semi-conductor.

Because of its thinness, the thin film will be substantially transparent to the laser radiation. This will ensure adequate penetration of the film by the laser radiation.

b) Substrate

The essential requirement of the substrate 14 is not only to function as a support or carrier for the thin film 12, but also to provide a proper crystallographic support which favors the deposition of the thin film with a distinct crystallographic texture. It is, therefore, preferred that the substrate be of a single crystal material such as silicon which is readily available.

It is also necessary that the thin film be substantially electrically isolated or insulated from the substrate.

In the case where the device is to function as a monitoring device, the substrate must also be transparent to the laser radiation.

Silicon represents an especially preferred substrate for a tellurium thin film.

Silicon is readily available in the form of single crystal wafers and is transparent to radiation at a wavelength of 10.6 $\mu$m which is the wavelength of laser radiation from a $CO_2$ laser.

One means of isolating or insulating the substrate from the thin film is to employ a substrate of high resistivity. Silicon is a semi-conductor but since it is of n-type it is suitable as a support for p-type thin films such as tellurium films. The use of an n-type substrate with a p-type thin film provides a space charge region at the interface of the thin film and the substrate resulting in electrical isolation of the film from the substrate.

c) Device Parameters and Manufacture

Certain of the fabrication conditions employed in forming the thin film on the substrate and parameters of the substrate are found to affect the performance of the device of the invention.

In particular the thin film may be formed by vacuum deposition on the substrate and it is found that the substrate temperature, evaporation rate, film thickness, substrate orientation and surface quality of the substrate affect the grain size, crystallinity and electrical and electro-optical properties of the thin film. Annealing also affects the structure and electrical properties of the thin films.

i) Substrate Temperature

The substrate temperature is found to have a significant effect on the crystalline structure and morphology of the thin film.

In particular the grain size of the crystalline structure increases with substrate temperature at substrate temperatures in the range of 50°–300° C.

Figures 4, 12:
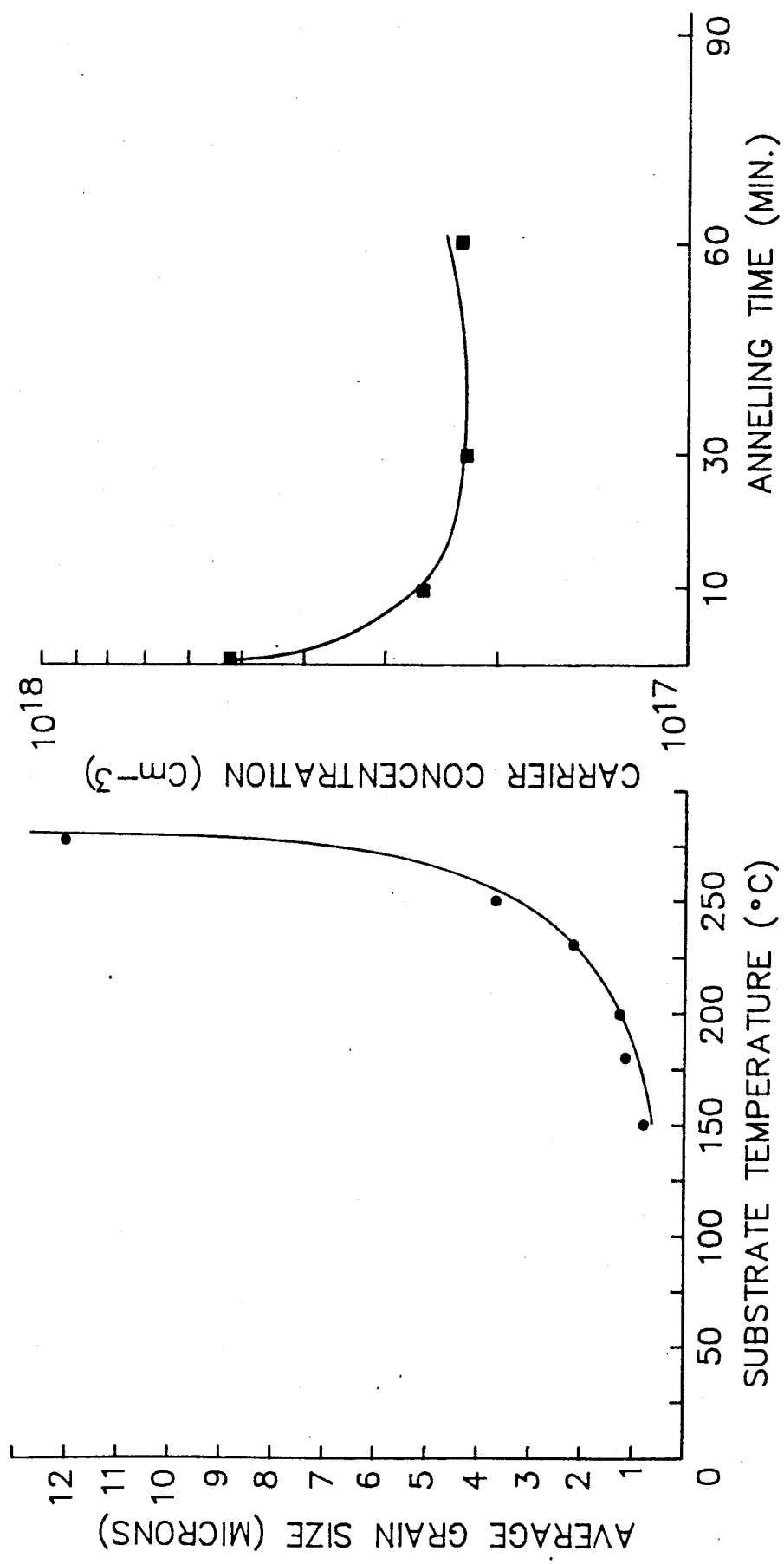
FIG. 4 shows graphically the variation of grain size of a tellurium film with substrate temperature.
FIG. 12 shows graphically variation of carrier concentration with annealing time.
Figure 5:
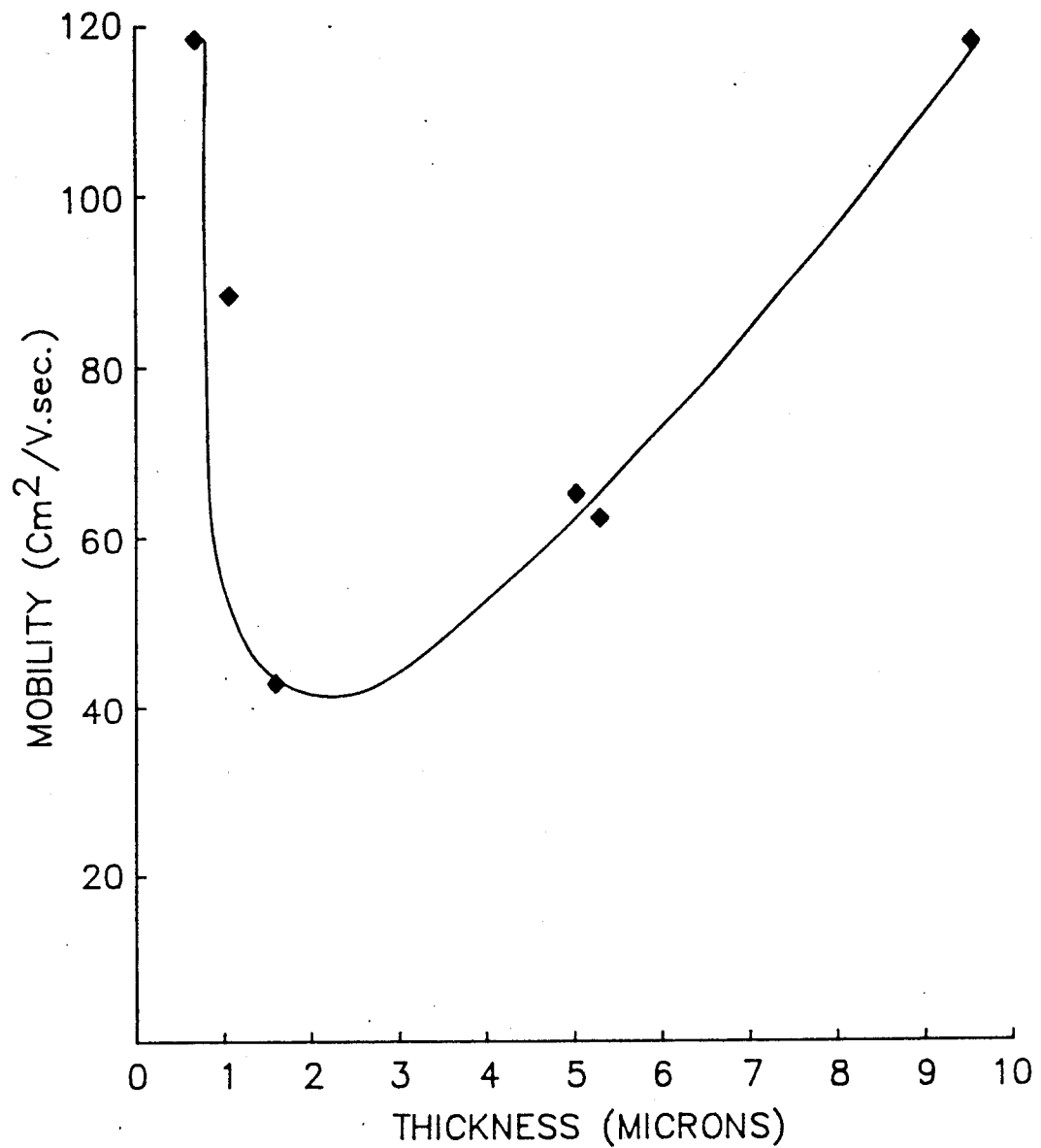
FIG. 5 shows graphically variation of mobility of a tellurium film with film thickness.
Figure 6:
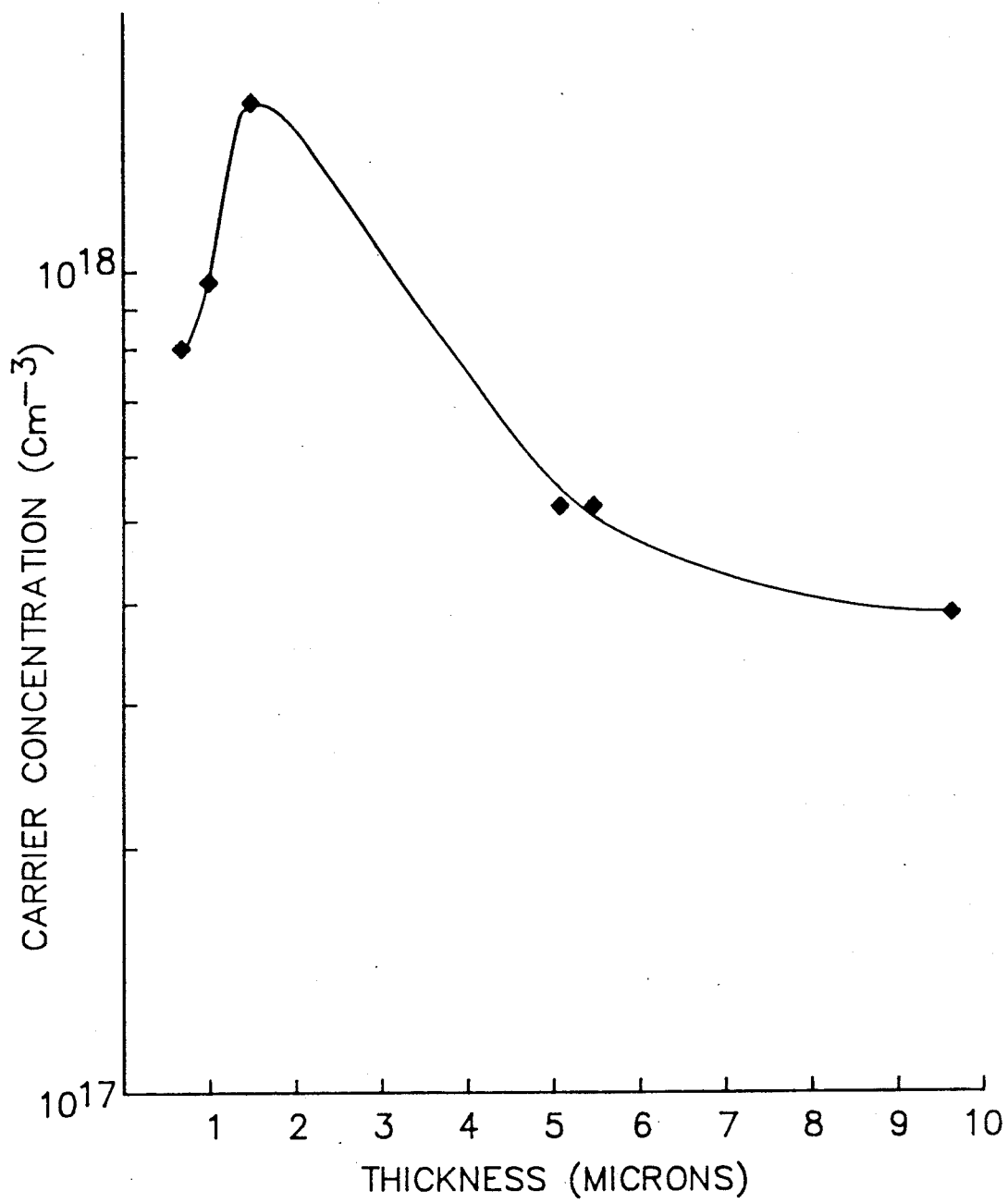
FIG. 6 shows graphically variation of carrier concentration of tellurium film with thickness.
Figure 7:
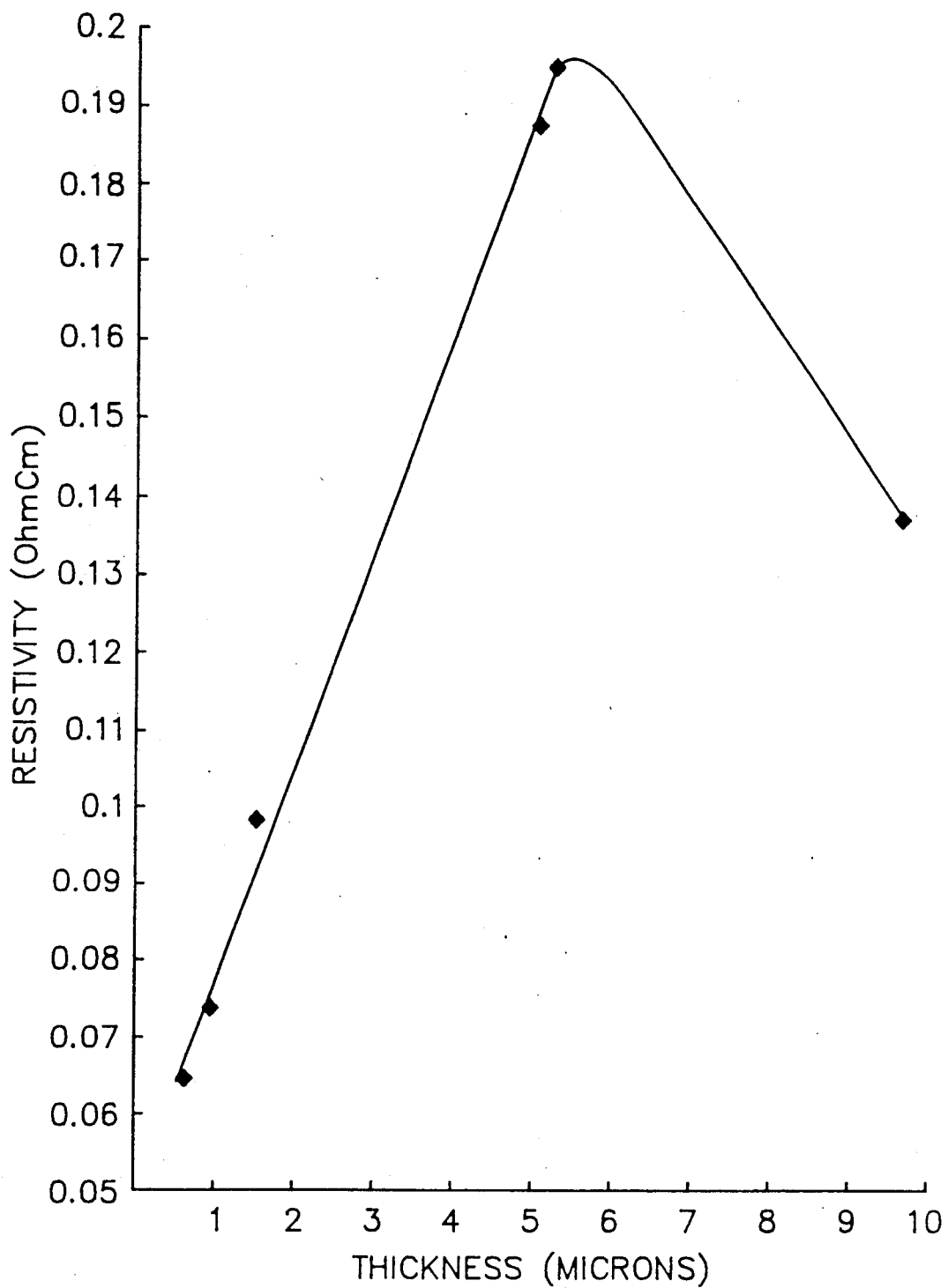
FIG. 7 shows graphically variation of resistivity of a tellurium film with thickness.
Figure 8:
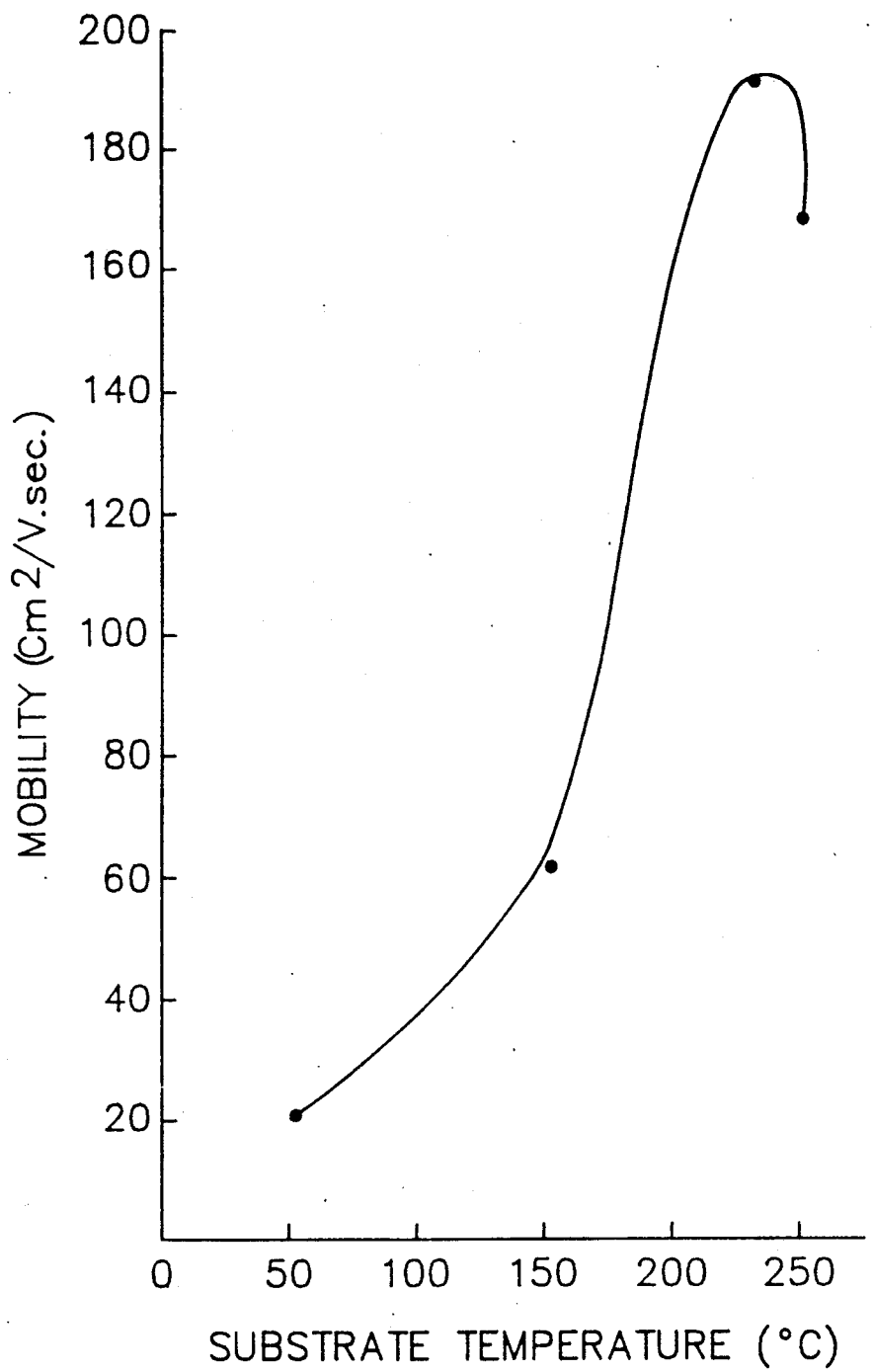
FIG. 8 shows graphically variation of mobility with substrate temperature.
Figure 10:
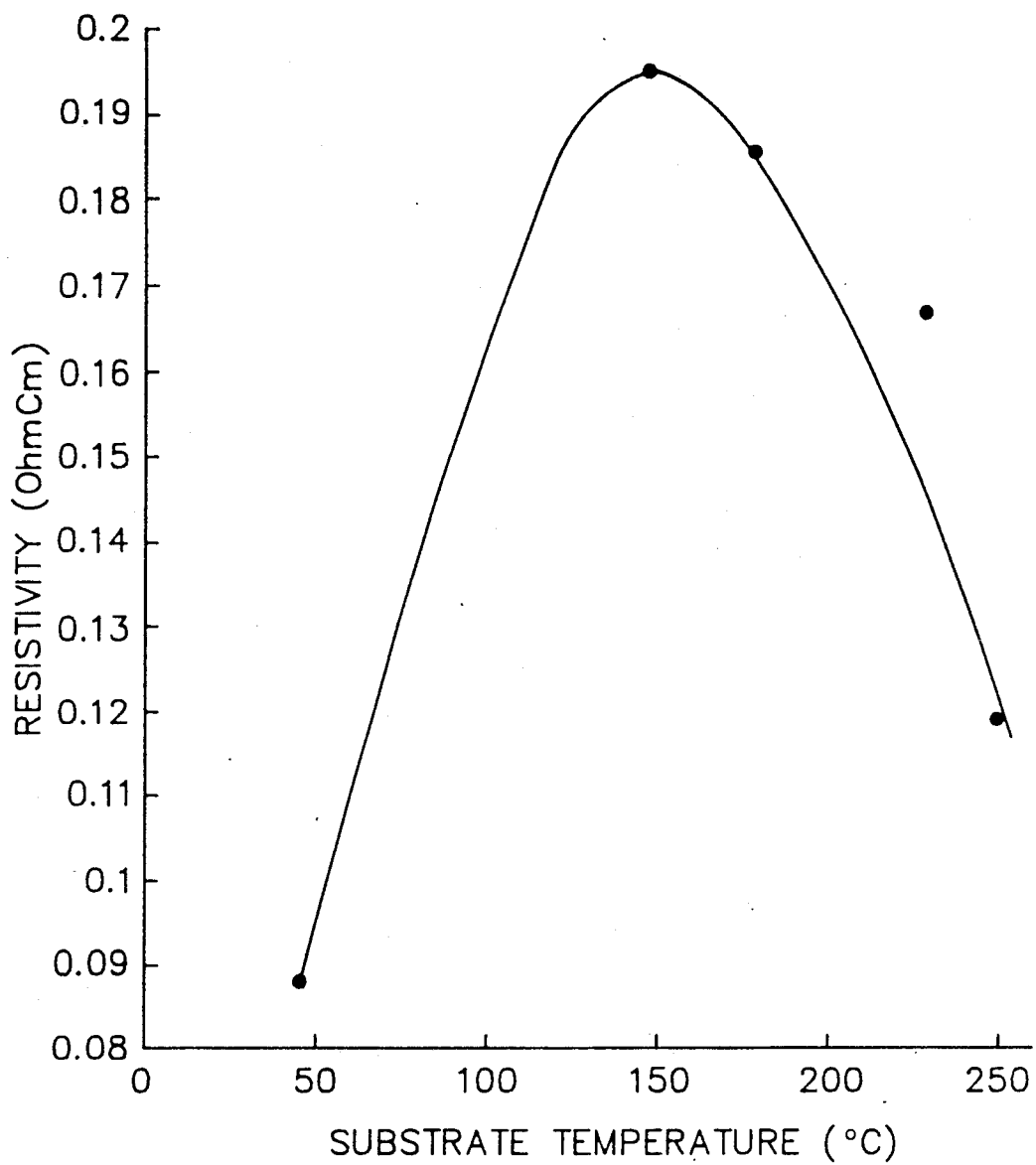
FIG. 10 shows graphically variation of resistivity with substrate temperature.
Figure 9:
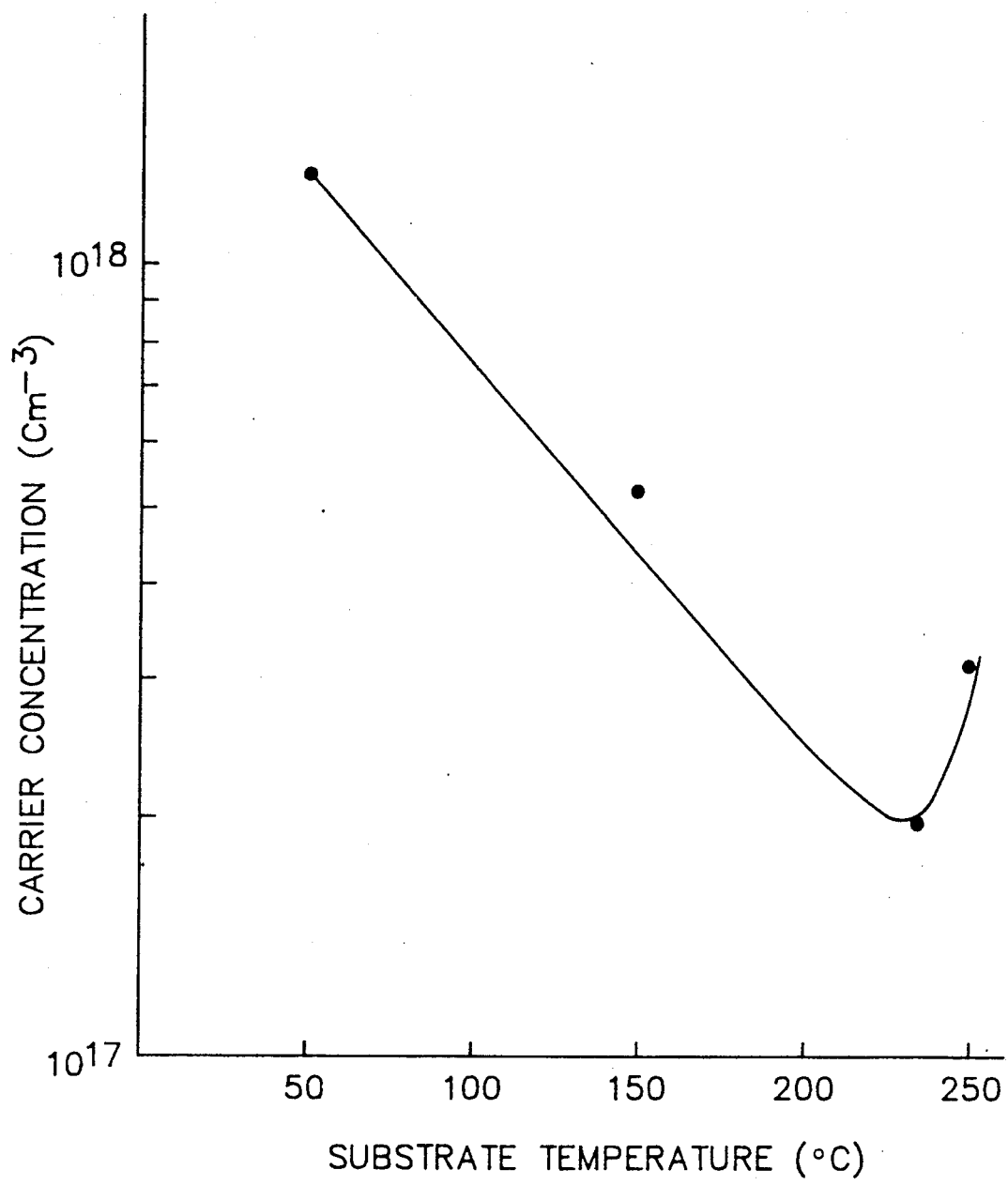
FIG. 9 shows graphically variation of carrier concentration with substrate temperature.
Figure 11:
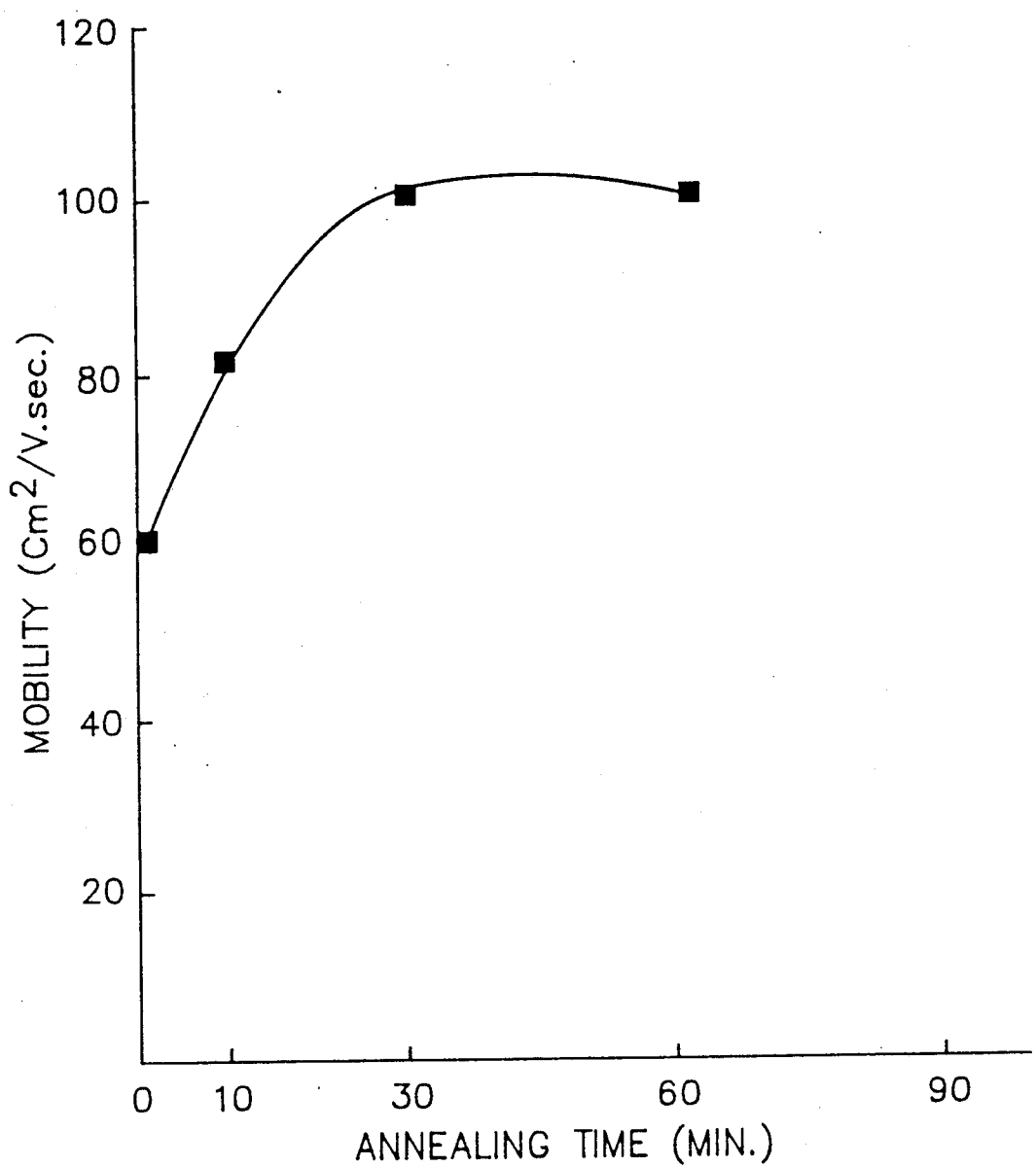
FIG. 11 shows graphically variation of mobility with annealing time.

Thin films of tellurium grown on the (100) or (111) planes of silicon demonstrate a rapid increase in average grain size with increasing substrate temperatures in the range 200°–280° C., particularly 250° to 270° C. In this substrate temperature range the average grain size increases from about 1 to about 12 microns, as particularly illustrated in FIG. 4. A similar trend of grain size growth is exhibited when employing unpolished silicon wafers as substrate.

It appears that at small film thicknesses the individual grains have no special crystallographic shape but in the course of migration they join to form prisms having faces parallel to the substrate surface. In the preferred case of tellurium thin films on a silicon substrate, a substrate temperature of 100° to 200° C., preferably 150° C. is found to provide the largest induced voltage.

ii) Evaporation Rate

At each substrate temperature there is a critical source temperature below which complete coverage of the substrate does not occur. Table I below shows the effect of different source temperatures at different substrate temperatures for tellurium semi-conductor material and silicon substrate:

TABLE I

Deposition condition for the tellurium films grown at different substrate temperatures.

| Subst. Temp. (°C.) | Source Temp. (°C.) | Evap. Time (min.) | Average Grain (Microns) |
|---|---|---|---|
| 150 | 460 | 30 | 0.7 |
| 180 | 475 | 40 | 1 |
| 230 | 480 | 30 | 2 |
| 250 | 485 | 35 | 3.5 |
| 280 | 490 | 35 | 12 |

Investigation of the evaporation rate effect on the grain growth of tellurium thin films at source temperature of 460° to 475° C. at constant substrate temperature of 150° C. demonstrate an increase of surface roughness and decrease of average grain size in the thin film with increasing evaporation rate. In the preferred embodiment of a tellurium thin film on a silicon substrate the optimum source temperature for maximizing the induced voltage is found to be about 475° C.

iii) Film Thickness

Deposition of tellurium thin films on silicon substrates at constant source and substrate temperature, 470° C. and 150° C., respectively, for different durations from 15 to 75 minutes shows a decrease in grain size and increase in surface roughness of the film with increase in film thickness.

In the case of the preferred devices having a tellurium film on a silicon substrate the highest induced voltages occur at film thicknesses of 4 to 7 $\mu$m, preferably 5$\mu$m.

iv) Substrate Crystalline Orientation

Film deposition studies show that under the same deposition conditions, tellurium vapor condenses on the (100) plane of silicon faster than the (111) plane of silicon. This indicates that the (100) plane of silicon has a better match with tellurium structure and the binding of the tellurium thin film is stronger with the (100) plane than the (111) plane. As a consequence the average grain size of tellurium thin film grown on the (100) plane is larger than that on the (111) plane of silicon and this is borne out by micrographs.

Thus tellurium thin films grown on the (100) plane of silicon have overall improved crystalline orientation, binding and grain size over those grown on (111) planes.

v) Substrate Surface Quality

The smoothness and uniformity of the thin films is greatly improved in the case of polished substrates as compared with unpolished substrates. When the substrate surface is unpolished or rough, the random surface fluctuations act as nucleation centres on which the semi-conductor material grows favourably.

vi) Heat Treatment

Vacuum annealing at temperatures of the order of 250° C. does not improve the thin film structure and higher annealing temperatures lead to deterioration of the thin film by volatilization or re-evaporation.

Heat treatment in an atmosphere of argon results in increase in the average grain size with increasing annealing temperature in the range 300° to 400° C., however, annealing at the upper end of the range results in microcracks in the thin film. Annealing at 350° C. for different time periods from 10 to 90 minutes displays an increase in average grain size with annealing time, however, at longer annealing times re-evaporation occurs thus rendering long annealing times impractical.

A particularly favourable annealing condition for obtaining tellurium thin films with large grain size and low defects is heat treatment for about 60 minutes in argon.

In the case of the preferred devices having a tellurium thin film on a silicon substrate, a short annealing time below 30 minutes results in a significantly reduced induced voltage. Annealing times of at least 60 minutes produce the desired high induced voltage.

vii) Electrical and Electro-optical Characteristics

The electrical properties of the thin films, more especially the mobility and carrier concentration are affected by the substrate temperature, film thickness, evaporation rate and annealing as demonstrated in FIGS. 5 to 12 for tellurium films on silicon substrates.

The measured mobilities vary with fabrication conditions from 21.5 to about 191 $cm^2/V.S.$ with a corresponding variation in carrier concentration of $1.9 \times 10^{17}$ to $3.3 \times 10^{18}$ $cm^{-3}$.

Mobility decreases with increase of film thickness up to about 2 um and increases at higher film thicknesses. As the mobility increases the carrier concentration decreases.

Electrical properties of two tellurium thin films grown at substrate temperature of 150° C. and source temperatures of 463° C. and 470° C., respectively are shown in Table II below:

TABLE II

Electrical properties of two samples grown at substrate temperature of 150° C. and two different source temperatures.

| Source Temp. | $\mu$ $cm^2/V.S.$ | $p$ $cm^{-3}$ | $\rho$ Ohmcm |
|---|---|---|---|
| 463 | 117.5 | $3.87 \times 10^{17}$ | 0.137 |
| 470 | 38.4 | $5.2 \times 10^{17}$ | 0.312 |

Tellurium has a trigonal system with a 32 point group symmetry. The Bravais lattice of tellurium single crystal is hexagonal, and three atoms are associated with each lattice site, each being generated by a rotation of 120° in the horizontal plane about the [001] direction and a translation of c/3 in that direction with respect to its nearest neighbour. The resulting structure is a network of spiral chains parallel to [001] direction, which chains are held together by weak forces of the Van der Waals type; the unit cell is a regular parallelepiped comprising a quarter of the hexagon.

The electro-optical properties of tellurium are best described by taking its three major axes as references. These axes are c-axis (or 3-axis), a-axis (or 1-axis) and the axis perpendicular to a and c axes which is called the 2-axis. These axes are equivalent to [001], [110] and [100] directions, respectively.

Silicon, on the other hand, has a diamond structure which is, in essence, two interfering FCC (face-centered cube) structures separated from each other by a vector along the diagonal of the unit cell cube with a length of one quarter of the diagonal The (100) and (111) planes of silicon are the planes used for the growth of tellurium. The silicon atoms on the (100) planes form a centered square network of side that is, the unit cell size. The (111) planes have a centered hexagonal atomic arrangement of side $a\sqrt{2}/2$.

The updated values of tellurium and silicon lattice dimensions are shown in Table (III) below.

TABLE III

| Te | Si | Mismatch |
|---|---|---|
| a = 4.44669 A° | a = 5.4305 A° | 18% |
| c = 5.91492 A° | c = a | 8.9% |

The mismatch is defined as the relative difference, in percent, between the lattice dimensions of the two materials. The last column of Table III shows the mismatch between tellurium and silicon lattice dimensions. In order to achieve successful heteroepitaxy of one material on the top of the other material, it is generally considered that the mismatch should be less than 10 percent and that they should have similar structures. As shown in Table III, silicon has a large mismatch with tellurium. In addition, tellurium and silicon structures are not similar. Therefore, none of the conditions for epitaxial growth are satisfied and, consequently, one would not expect to achieve a single crystalline film of tellurium on a silicon substrate. However, it might be expected that tellurium films grown on silicon single crystal substrates would have a higher degree of orientation than those grown on amorphous substrates such as glass. The great advantages of silicon, such as its transparency at 10.6μ, justify the use of this material as substrate instead of other materials such as quartz which have a better match with tellurium, but are expensive, opaque and are therefore at a disadvantage with respect to silicon.

Table IV below indicates the relative intensities of different crystallographic planes of tellurium obtained from samples prepared on unpolished Si(111) wafers at different substrate temperature. The ASTM (American Society for Testing Materials) data which are obtained from unoriented powder specimen, are also included in the last row of the Table IV for comparison. These results, from orientation points of view, are the best results obtained from a number of samples prepared at different conditions.

TABLE IV

Powder diffractometer results for tellurium films grown on (111) plane of unpolished silicon wafers.

| Sample No. | S.T. °C. | 100 | 101 | 102 | 110 | 111 | 003 | 200 | 201 | 112 | 103 | 202 | 113 |
|---|---|---|---|---|---|---|---|---|---|---|---|---|---|
| 1 | 100 | — | 33 | 100 | — | — | — | — | — | 11 | — | 8 | 41 |
| 2 | 150 | — | 100 | 93 | — | 5 | 2 | — | 8 | 7 | 4 | 16 | 20 |
| 3 | 200 | — | 100 | 52 | 36 | 14 | 9 | 8 | 30 | 15 | — | 18 | 13 |
| 4 | 250 | — | 64 | 100 | — | — | — | — | — | 11 | — | 13 | 35 |
| ASTM | — | 20 | 100 | 37 | 31 | 11 | 8 | 4 | 20 | 7 | 2 | 12 | 13 |

Except for the sample No. 1, the relative intensities for the rest of the samples are more or less similar to the random case. The common feature of all results in Table IV is that the relative intensity of the (102) planes are higher than the random case. For the samples No. 1 and 4 the (102) reflection has the strongest peak in the diffraction pattern. In all the cases the relative intensities are different from the ASTM data, that is, they show, with different degrees a preferred orientation.

Table V below shows the powder diffractometer results from thin films prepared on (100) planes of polished silicon wafers. The results from samples prepared under the same conditions are, to a great extent, reproducible. The samples No. 1 and 2, prepared at 200° C. show remarkable difference with ASTM. In these samples the strongest peaks are those of (102) planes while the other peaks are either absent or very weak compared to those of ASTM numbers. On the other hand, the relative intensities of the samples No. 3, 4 and 5, prepared at 250° C., are somewhat similar to those of ASTM.

TABLE V

Powder diffractometer results for tellurium films grown on (100) plane of polished silicon wafers.

| Sample No. | S.T. °C. | 100 | 101 | 102 | 110 | 111 | 003 | 200 | 201 | 112 | 103 | 202 | 113 |
|---|---|---|---|---|---|---|---|---|---|---|---|---|---|
| 1 | 200 | — | 6 | 100 | — | — | — | — | — | — | 2 | — | 18 |
| 2 | 200 | — | 3 | 100 | — | — | — | — | — | — | 2 | — | 12 |
| 3 | 250 | 5 | 100 | 55 | 17 | 6 | 3 | — | 10 | 9 | 2 | 17 | 19 |
| 4 | 250 | 9 | 100 | 32 | 34 | 8 | 7 | 23 | 23 | 9 | 4 | 16 | 23 |
| 5 | 250 | 30 | 100 | 20 | 41 | 12 | 4 | 8 | 26 | 6 | — | 15 | 13 |
| ASTM | — | 20 | 100 | 37 | 31 | 11 | 8 | 4 | 20 | 7 | 2 | 12 | 13 |

Table VI below shows the diffractometer results from samples prepared on (111) planes of polished silicon wafers. Table VI shows essentially similar results to those of Table V, i.e., samples prepared at 200° C. show a strong orientation of (102) planes and at higher substrate temperatures the results are more or less random. This can be understood by the fact that at higher substrate temperatures, the evaporation rate had to be extremely high in order to achieve a continuous thin film. At high evaporation rates, the deposited atoms are buried under the stream of evaporated atoms, continually arriving to the substrate surface, before having an opportunity to have sufficient surface migration necessary for the oriented recrystallization of grains. Therefore, although at higher substrate temperatures an improved orientation is expected, the high evaporation rate has counter-balanced the effect of substrate temperature and resulted in an almost unoriented thin film.

TABLE VI

Powder Diffractometer results for tellurium films grown on (111) plane of polished silicon wafers.

| Sample No. | S.T. °C. | 100 | 101 | 102 | 110 | 111 | 003 | 200 | 201 | 112 | 103 | 202 | 113 |
|---|---|---|---|---|---|---|---|---|---|---|---|---|---|
| 1 | 200 | — | 2 | 100 | — | — | — | — | — | — | — | — | 14 |
| 2 | 200 | — | 5 | 100 | — | — | — | — | — | — | — | — | 18 |
| 3 | 250 | — | 100 | 84 | 20 | 9 | 8 | — | 13 | 11 | 4 | 22 | 7 |
| 4 | 250 | 7 | 100 | 60 | 36 | 16 | 8 | 6 | 32 | 5 | — | 26 | 21 |
| 5 | 250 | 14 | 100 | 41 | 70 | 20 | 12 | 13 | 41 | 17 | — | 27 | 22 |
| 6 | 270 | 32 | 100 | 53 | 59 | 10 | 8 | 15 | 31 | 9 | — | 18 | 19 |
| ASTM | — | 20 | 100 | 37 | 31 | 11 | 8 | 4 | 20 | 7 | 2 | 12 | 13 |

The diffractometer studies showed that the thin film of tellurium on the unpolished surfaces of silicon did not have a controllable orientation. On the other hand, it was found that the thin film prepared on polished substrates has a controlled and reproducible structure.

The samples obtained at substrate temperatures higher than 200° C. are almost unoriented. This is attributed to the high deposition rates used at these substrate temperatures.

Diffraction patterns obtained from the forward reflection of tellurium thin films show that Deby rings case are discontinuous indicating the existence of preferred orientation in the sample. Table VII below shows the measured and calculated values of r for different reflections. The difference between the measured and calculated values of r is due to the fact that the interplanar spacings used for calculation of $\theta$, and the values of r, are those of single crystals while these qualities in a polycrystalline sample are known to be slightly different from a monocrystalline sample. This difference is due to compressive and tensile strains that the grains impose on each other at their boundaries. In all cases the interplanar spacings in tellurium thin film samples are smaller than those of the single crystal.

TABLE VII

The measured and calculated values of Deby arcs radii for different crystallographic planes.

| Measured r mm | Calculated r mm | (hkl) |
|---|---|---|
| 12 | 11 | 100 |
| 14.5 | 13.4 | 101 |
| 19.5 | 18.1 | 102 |
| 22 | 19.1 | 110 |
| 25 | 20.4 | 111 |
| 27.5 | 21.6 | 003 |
| 31 | 22.1 | 200 |

Transmission photographs of tellurium thin films show a fiber texture in the film with the fiber axis close to normal to the film plane.

When the crystalline structure of tellurium thin films grown at 50°, 150°, 180°, 230° and 280° C. are examined by the pole figure method, it is shown that the films are preferentially oriented.

Above 150° C. the degree of orientation decreases with increase in the substrate temperature. This is in good agreement with powder diffractometer results. The film grown at 150° C. is the most highly oriented specimen. The pole figures of the film grown at 50° C. show a remarkable decrease of orientation with respect to that of 150° C. Thus, from an orientation point of view, 150° C. is about the optimum substrate temperature.

The [110] and [003] directions in all films is more oriented than the [200] direction which is some cases (such as in the case of samples grown at 230° and 50° C.) is entirely random.

The dependence of the thin film crystalline structure on the preparation conditions may be further demonstrated by determining the pole figures of two representative films from each varying condition set, for example, film thickness and evaporation rate, which had shown noticeably different electro-optical behavior.

In examining the effect of the film thickness on the crystalline structure of the thin films, the pole figures of samples 2 and 5 $\mu$m thick were determined. According to these pole figures, the 5 $\mu$m thick sample possesses overall a higher state of orientation than that of the 2 $\mu$m thick sample. this is attributed to the autoannealing effect occurring at longer evaporation times, where the actual temperature of the growing film is known to be much higher than the nominal substrate temperature.

The dependence of the tellurium film crystalline structure on the evaporation rate can be demonstrated by examining two films grown at source temperatures of 470° and 475° C. The film grown at source temperature of 470° C. is found to have a stronger orientation than that of the film grown at 475° C. This is explained in that up to a certain level, higher evaporation rates can increase the actual temperature of the growing film by bombarding the substrate with high energy evaporated particles. This effect improves the crystallinity of the finished film. Above this limit, high evaporation rate, restricts the surface mobility of the film material and the crystallinity of the thin film begins to deteriorate. The stronger orientation of the film grown at source temperature of 470° C. suggests that the evaporation rate associated with this source temperature is close to the above mentioned limit such that the film grown at a higher source temperature of 475° C. is less oriented.

The annealing effect on crystallinity of the tellurium thin films is also evaluated by determining the pole figures of an unannealed film and two films annealed at 350° C. in argon for 10 to 30 minutes. Comparison of the pole figures of the unannealed film with those of annealed films shows that the degree of crystallinity decreases drastically with a short annealing. On the other hand, crystallinity of the film annealed for 30 minutes, is slightly improved compared to a film heat treated for 10 minutes. Therefore, it appears that after a major loss of crystallinity caused by a shorter annealing, the degree of crystal or crystallite orientation increases continuously with extended annealing times.

Powder diffractometer results confirm that tellurium films grown on silicon substrates are textured. It has also been found that tellurium films grown on polished wafers, as opposed to the films on unpolished substrates, give rise to reproducible diffraction patterns.

This technique demonstrates that the orientation of tellurium thin films diminishes with increasing the substrate temperature.

Precession photographs taken of tellurium films clearly show the existence of a texture in the tellurium thin films structure. The orientation analysis of such photographs shows that some crystallographic directions are uniformly distributed around the film plane normal and some other directions are preferentially confined to a small region of space.

Pole figure measurements made on films prepared under various conditions, generally, confirmed the results of the other techniques, i.e., they showed that above the substrate temperature of 150° C. the crystallinity of the films degrades and, also, that some crystalline directions, such as the a and c-axes, in most of the thin films are preferentially oriented in a limited region, while some other directions, such as the 2-axis, are more or less randomly oriented around the film plane normal. From the pole figures of films grown at different substrate temperatures, it has been found that the strongest crystallinity is obtained at around 150° C.

viii) Detection Mechanism

Experimental results show that the electric signals, induced in tellurium thin films by the $CO_2$ or the Nd:YAG laser radiation correspond to a fast detected signal the magnitude of which may be varied by changing the film fabrication conditions. On the other hand, the film preparation conditions have an effect on the granular structure, electrical properties, and crystallinity of the thin films. Therefore, it seems that the detection related electro-optical properties of the thin films are closely related to the above mentioned crystalline parameters.

It has been observed that the tellurium thin film device electrical response is, generally, identical to the detection response in bulk single crystal tellurium detectors. However, the observed signals in the devices of the invention can often be distinctly higher than those observed in such bulk single crystal configurations.

The signals induced in tellurium thin films by the $CO_2$ laser radiation can be, relative to the bulk single crystal response, extraordinarily high. In fact, it can be demonstrated that the magnitude of the induced signals in a nearly optimized Te/Si device is distinctly higher than the induced signals observed in tellurium bulk single crystal devices exposed to the same laser radiation power density.

In the present invention, the thin films are deposited normal to the substrate. This has been assured by setting the substrate parallel to the source surface and placing the substrate directly above the source. The source and substrate have had roughly the same area so that oblique deposition caused by the point source effect has been avoided.

Observation of the fast electrical signals induced in tellurium thin films by the $CO_2$ laser radiation, where rise times of the order of nanoseconds are reproduced, implies that a much faster mechanism is involved in the devices of the invention as compared with prior devices.

The signals induced in Te/Si thin film devices of the invention are found to exhibit generally characteristics such as rise time, pulse width and shape, identical with those generated in tellurium single crystal detectors. On the other hand, since the signals induced in tellurium thin films represent a true replica of the laser output power profile, it would seem that the current generating mechanism such as nonlinear polarization and electrostriction effects can not be responsible for the observed signals in the Te/Si thin film devices; these two mechanisms are known to give rise to signals proportional to the time derivative of the laser power density. On the basis of these considerations it would seem that the same generating mechanism is responsible for the signals observed in the thin film devices as those in tellurium single crystal bulk detectors. This mechanism is identified as the second order non-linear resistivity in tellurium.

A polycrystalline film of tellurium consists of a large number of small crystal or crystallite entities each oriented generally in an arbitrary direction. By illumination of the thin film sample by the laser radiation, a finite electric current will be generated in each individual entity. The current generated in each crystallite has a specific direction depending on the relative position of the laser light and the crystallite. The net current density induced by the laser radiation in the plane of the thin film along the direction of electric signal measurement, is the projection of the net local current density, contributed to from all entities, along the measurement direction.

It can be demonstrated that no net current is generated in the film plane. It should be noted that in this case, again, the current along the film plane normal has a finite value.

A sample with a totally random crystalline orientation is one in which none of the crystalline axes are preferentially oriented. A random orientation may be considered as the generalization of a fiber texture, where the fiber axis is uniformly distributed in all directions.

When the c-axis of all crystals or crystallites are oriented normal to the substrate, no current is generated in either the film plane or its normal direction. Clearly, the situation will be the same if the c-axis is tilted with respect to the substrate but still maintained as a fiber axis. Therefore, in a randomly oriented sample, where the c-axes are uniformly distributed in all direction, this situation will be preserved and no net current will be generated in any direction.

When the a-axes of all crystals or crystallites are oriented normal to the substrate and the other two crystalline major axes are randomly distributed around the film plane normal, the current along the a-axis has a finite magnitude. It is clear that this finite current will be preserved even if the a-axes are not normal to the film plane. Therefore, in a crystal or crystallite distribution of this latter type, the projection of the current density along the common a-direction is expected to produce a measurable current in the film plane. If, on the other hand, the a-axes have themselves a finite spread, both in latitude and azimuthal direction, a finite electric signal in the film plane is expected. However, it is clear that the induced current in the film plane will decrease with the increase of the a-axis spread and will reduce to zero when the spread extends completely through the entire space. An orientation distribution for the a-axis as described above has been observed in all the tellurium thin film devices of the invention and demonstrated by pole figures.

When the 2-axis of all crystals or crystallites are oriented along the film plane normal and the other two axes are randomly distributed around this direction, a finite current can be induced by the laser radiation along the film plane normal. If, on the other hand, the 2-axes have a finite spread in latitude and azimuthal directions, a finite current is still expected in the film plane. In all these configurations, since the signal is uniquely due to the photon drag effect, it is expected that the induced signal reverses polarity with the reversal of the laser propagation direction.

In the case of the devices of the invention the polarity of the laser induced electric signal remains unchanged with the reversal of the propagation direction of the laser beam; this indicates that any contribution from the photon drag effect if at all is clearly negligible. The optical rectification mechanism appears to be the only source for the induced currents and hence voltages in the devices of the invention.

The induced voltage is critically dependent on the physical parameters describing the tellurium films; namely, resistivity $\rho$ and optical rectification coefficient $<X'>$.

The resistivity $\rho$ of devices is an important parameter which can affect the measured voltage. The measured global resistivity of a multi-crystalline thin film results from the combination of the resistivity of the individual crystals or crystallites, $\rho_c$, which is to correspond to the single crystal value of the resistivity for the proper carrier concentration, and the resistivity $\rho_b$ introduced by the grain boundary barrier; i.e., $$\rho = \rho_c + \rho_b$$

The crystalline defects in tellurium act as impurity centers; in a tellurium thin film where the individual crystallites carry a large number of crystalline defects and surface states, the crystallites carry a high density of impurity centers and, therefore, they correspond to a heavily doped low resistivity material.

Resistivity measurements show that the resistivity of devices of the invention is not greatly different from that of the intrinsic single crystal. Consequently, it appears that the measured resistivity in the case of the tellurium thin films is mainly due to the resistivity caused by the grain boundary effect and $\rho_c$ has a negligible contribution to the sample resistivity.

The magnitude of the optical rectification coefficient, $<X'>$ depends on the degree of crystallite orientation in the thin films. This term is larger in highly oriented specimens. For a given orientation characteristics, however, the optical rectification tensor $\chi$ of individual crystallites is highly dependent on the impurity concentration as well as other carrier scattering mechanisms. It has been experimentally shown that $\chi$ increases with increasing carrier concentration by a factor of about 30, going from intrinsic tellurium to a carrier concentration of $10^{20} cm^{-3}$. The carrier concentration in tellurium crystallites is expected to be very large. Therefore, the X values in the crystallites should correspond to those of a heavily doped tellurium crystal. As a result, the tellurium thin films, compared to the intrinsic bulk single crystal, exhibit greatly enhanced $\chi$ values without having their resistivities appreciably affected. This theory explains the appreciably higher induced voltages demonstrated in the present invention compared to the case of single crystal devices when exposed to a laser radiation with the same geometric parameters.

The magnitude of the induced signals in tellurium thin film devices may vary widely with alteration of the fabrication conditions.

The induced signal is determined by a number of factors such as the details of crystalline configuration and resistivity of the sample. The crystalline profile and resistivity of the thin films sensitively depend on the film fabrication conditions. The combined variations of resistivity and crystalline structure of the samples determine the variations in the laser induced voltage.

Pole figures obtained from devices of the invention demonstrate that films grown at 150° C. have the highest degree of crystallite orientation; on the other hand, the crystalline orientation distribution of the thin films broadens when the substrate temperature deviates from 150° C.

The variation of resistivity with substrate temperature, is such that it shows an increase in resistivity when the substrate rises from 50 to 150° C. where it shows a maximum and then it decreases with elevating the substrate temperature from thereon.

It is found that the carrier concentration decreases monotonically with increase in the substrate temperature from 50° to 230° C. and, it is expected that the $\chi$ values decrease with increasing the substrate temperature.

It appears clear that the laser induced voltage will be optimized at a substrate temperature of 150° C. where, both $\rho$ and $<X'>$ are expected to be the highest. This is consistent with the observed variation of the laser induced voltages with substrate temperature.

The pole figures also show that the degree of crystal or crystallite orientation of the film varies with the change of the evaporation rate. Based on the pole figure results it seems that the degree of crystal or crystallite orientation in the thin films increases up to the evaporation rate corresponding to a source temperature of 470° C. beyond which it will begin to decrease.

The resistivity measurement results on the films grown at different evaporation rates shows also that the sample resistivity increases with source temperature up to 470° C. where it is increased by a factor of three.

Therefore, it appears that the induced voltage will be optimized at an evaporation rate corresponding to a source temperature of 470° C. This is consistent with the observed variation of the laser induced voltage with the source temperature.

It is found that crystallinity of thin films varies with variation of the film thickness. The pole figures of the samples 2 and 5 $\mu$m thick show that with increasing the thickness from 2 to 5 microns, the degree of crystal or crystallite orientation in the thin films increases. It appears that the degree of crystallite orientation increases up to 5 um, corresponding to the point of the highest induced voltage and then decreases beyond this thickness. The latter deterioration of crystallinity is likely due to the growth of new grains on the top of existing crystallites, nucleated by the residual gas particles. The crystalline orientation of these new grains may be twisted with respect to their underlying crystals or crystallites. Therefore, beyond a certain optimum thickness, assumed to be about 5 um for the case of the thin films of the invention, these newly grown crystals or crystallites can randomize the crystal or crystallite orientation distribution of the film.

In the thickness ranges used, the resistivity of the films varies by a factor of three, the highest resistivity belonging to the film which is around the optimum thickness. Therefore, the observed variations of the laser induced voltages in devices of the invention of different thickness is satisfactorily consistent with the expected effect of the variations in crystallinity and resistivity of these devices.

The photovoltage decreases drastically as a result of a short annealing heat treatment and then rises with increase in the annealing time. The variations of the mobility and carrier concentration with annealing time is such that the resistivity remains fairly unchanged in the whole range of annealing times. Therefore, this factor can not have any role on the observed variations of the photovoltages with annealing time. The optical rectification, however, seems to have a marked effect on the induced voltages and it is this parameter that dictates the observed induced voltage variations. Comparison of the pole figures from an unannealed film and that of a film annealed for 10 minutes shows that the degree of crystal or crystallite orientation of the thin films decreases drastically as a result of a short annealing. Therefore, it seems that the great loss of the induced voltage with a short annealing time is caused mainly by decrease of the degree of crystal or crystallite orientation. In longer annealings, however, the crystallinity of the thin films improves and this effect is likely responsible for rise of the signal.

There is a practical limit for annealing time beyond which the thin films develop cracks and pinholes. The crystallinity of the samples improves up to this practical limit such that the induced voltage returns to its initial value (that of unannealed film) after 60 minutes annealing at 350° C. The interpretation of the observation in this section is clearly consistent with the observed variation in the laser induced voltages. Indeed, annealing does not have any effect on the film resistivity whereas, the degree of crystal or crystallite orientation has a decrease at the beginning and increases later on with extended annealing times. Thus, the net effect on the induced voltage is expected to depend on the change in the value of the product of $\rho$ and $<X'>$. Thus, the experimental observation is reasonably verified by the fact that annealing reduces the induced voltage by reduction of $<X'>$ and it eventually tends to increase the induced voltage by increase of $<X'>$.

xi) Characteristics of Thin Film Devices

The overall performance of the nearly optimum tellurium thin film devices of the invention is superior to many conventional room temperature detectors for the $CO_2$ laser. Therefore, it is useful to elaborate the detector characteristics of Te/Si devices.

The terms conventionally used to characterize the photodetector performance are as follows:

1) The responsivity $R = \Delta V/\Delta W$, in volts/watts, where $\Delta V$ is the output voltage produced by a change $\Delta W$ in the incident power radiation;
2) The Noise Equivalent Power (NEP), in watts/Hz$^{\frac{1}{2}}$, is the incident power required to give an output voltage equal to the noise voltage from the detecting system within unity bandwidth;
3) The specific Detectivity $D^*$, which is defined as the reciprocal of the NEP times the square root of the area A of the detector element, i.e., $D^* = NEP^{-1} \times A^{\frac{1}{2}}$;
4) The response time $\tau$, which is a measure of the time necessary for the detector to react to an instantaneous change in the incident power flux;
5) Damage threshold level, in watt/cm$^2$, which is the maximum power density that a detector can stand before it experiences a permanent damage in its crystalline structure.

Having thus defined the performance parameters of a photodetector, the device characteristics of the nearly optimum Te/Si device are outlined below:

a) Responsivity

The highest responsivity achieved with devices of the invention was about 16mV/kW for an active area of 1 mm$^2$. This responsivity is distinctly higher than the highest responsivity for a tellurium single crystal detector with the same active area. It is also about twice the responsivity of a pyroelectric device with the same active area which is typically of the order of 8mV/kW. The extraordinarily high responsivity of tellurium thin film devices is superior to all commercially available room temperature $CO_2$ laser detectors.

b) Noise

Since a Te/Si thin film device is a photovoltaic device used without any electric supply, the only source of noise within the material is thermal or Johnson's noise; the magnitude of the noise rms voltage v per unit bandwith is given by $$v=[4kTR]^{\frac{1}{2}}$$

where kT is the thermal energy and R is the sample resistance. The resistance R varies from sample to sample and with devices of the invention for a nearly optimum device it is about 200n. Thus, the noise voltage at room temperature will be $1.8 \times 10^{-9}$V.

c) NEP

Using the previously stated responsivity of 16mV/kW and the calculated noise voltage of $1.8 \times 10^{-9}$ volts, the NEP is evaluated to be about $1.12 \times 10^{-4}$ Watt/$Hz^{\frac{1}{2}}$.

d) Detectivity

The detectivity D* of the device described above with an active area of 20 mm$^2$ is estimated to be about 3975Wcm/$Hz^{\frac{1}{2}}$.

e) Damage Threshold Level

This parameter has been experimentally found by determining the minimum power that causes a change of colour in the thin film. The damage threshold hold level has been found to be 600kW/cm$^2$. This can be improved dramatically using standard techniques for antireflection coating and other protection techniques.

f) Speed of Response

The speed of response of the device of the invention is expected to be limited by three fundamental times, namely, the dielectric relaxation time, the light transit time through the sample, and a characteristic response time of the emf generating mechanism.

The dielectric relaxation time is the time necessary for redistribution of the excess polarization charge associated with the dipole formed in the device under open circuit conditions. The magnitude of this characteristic time is pc which for an optimum thin film device is estimated to be $6 \times 10^{-12}$sec.

The transit time of light through the sample, given by nL/c, for the case of a thin film is expected to be extremely small due to short distance travelled by the light in the sample. This quantity for a typical tellurium thin film device is of the order of $8 \times 10^{-14}$ sec.

The optical rectification is considered to be responsible for the induced electric signals in tellurium thin films. The characteristic response time of this effect in tellurium seems to be associated with the interband transitions in the tellurium material. Therefore, this effect is expected to be characterized by a time constant of the order of $10^{-13}$ sec.

The fundamental response time is limited and determined by the longest of the above mentioned characteristic times. Thus, in the case of a tellurium thin film device the fundamental response time is set by the dielectric relaxation time which is of the order of $6 \times 10^{-12}$sec. In normal practical measurements, however, the RC time constant of the external circuitry is usually much longer than the fundamental response time of the device, such that the overall detection system response time is set by the RC time constant of the external circuit.

g) Device Configurations

In general, the devices used to measure the laser radiation power fall into two classes: detectors and monitors. In detectors the total radiation power is absorbed, whereas in monitors a negligible fraction of the incident radiation power is absorbed and most of it can be used for other purposes. An important advantage of a Te/Si device is that due to negligible absorption of the light in the thin film and in the silicon substrate, it can be used either as a detector or as a monitor, depending on the experimental requirements.

The above considerations show that Te/Si devices, in accordance with the invention, prepared under appropriate conditions, have performance parameters appreciably better than almost any conventional room temperature detector for the $CO_2$ laser radiation. The high performance with extreme ease and low cost of manufacturing make Te/Si detectors a candidate for substitution of commercially available room temperature $CO_2$, Nd:YAG and other detectors.

Based on the optoelectronic measurement results, the source mechanism of the fast electric signals induced in Te/Si thin film devices by a $CO_2$ laser is the optical rectification effect. It appears that the high responsivity of the devices of the invention is due to increased value of the third rank optical rectification coefficients in the thin films. The analytical expression developed for the generated voltage in a Te/Si thin film device shows that the major factors affecting the responsivity of the thin film devices are the degree of crystallinity, and resistivity of the samples. On the basis of the theory, which relates the structure characteristics and electrical properties of the thin films to their optoelectronic performance, the optoelectronic measurement results have been successfully interpreted.

Having identified the source mechanism of the induced signals in Te/Si devices, the detection performance parameters of a nearly optimized device have been determined. It has been shown that the performance of an optimum tellurium thin film device is superior to all commercially available pyroelectric and photon drag detectors and the device of the invention is a very promising substitute for the existing $CO_2$ laser room temperature detector.

We claim:

1. A method of detecting pulsed laser radiation comprising directing laser radiation in pulse form into a thin film of semi-conductor material of non-centrosymmetric lattice structure having a substantial crystallographic texture, said thin film having a thickness of 1 to 50 μm, inducing by optical rectification an electric current within said thin film responsive to the pulse form radiation, conducting said electric current from said film through a pair of electrical contact elements in direct ohmic contact with said thin films, developing an electrical signal responsive to said electric current, and determining said electrical signal as a measure of characteristics of the radiation.

2. A method according to claim 1, wherein said thin film is a film of tellurium having a thickness of 2 to 7 μm.

3. A method according to claim 1, said laser radiation being $CO_2$ laser radiation and said film being formed on a (100) plane of a single crystal silicon.

4. A method according to claim 1, said laser radiation being from Nd:YAG or any other higher power pulsed laser, and said film being formed on a crystallographic face of a single crystal silicon wafer.

5. A method according to claim 1, said laser radiation being from Nd:YAG or any other high power pulsed laser, and said film being formed on a crystallographic face of a single crystal or highly crystalline substrate.

6. A detection device for pulsed laser radiation comprising a thin film of semi-conductor material having a substantial crystallographic texture, on a surface of a substrate, said film being electrically isolated from said substrate, said thin film having a thickness of 1 to 50 $\mu$m, and a pair of electrical contact elements in direct ohmic contact with said thin film effective to conduct from said thin film an electric current induced within said thin film by optical rectification.

7. A device according to claim 6, wherein said film is of tellurium and said substrate is silicon.

8. An apparatus for detecting pulsed laser radiation comprising:
a thin film of semi-conductor material having a substantial crystallographic texture, said material being of non-centrosymmetric lattice structure, said thin film having a thickness of 1 to 50 $\mu$m,
a pair of electrical contact elements in direct ohmic electrical contact with said film, and
means for determining an electrical signal induced by optical rectification in said thin film by pulsed laser radiation, said means being in direct ohmic electrical contact with said electrical contact elements.

9. An apparatus according to claim 8, wherein said means comprises an oscilloscope.

10. An apparatus according to claim 9, further including an impedance transforming means electrically connected between said contact elements and said oscilloscope.

11. An apparatus according to claim 10, wherein said thin film is a film having a thickness of 2 to 7 $\mu$m, said film being supported on a single crystal silicon.

12. A method of detecting pulsed laser radiation comprising directing laser radiation in pulse form into a thin film of tellurium semi-conductor material of non-centrosymmetric lattice structure having a substantial crystallographic texture, said thin film having a thickness of 1 to 100 $\mu$m and being formed on a (111) plane crystallographic face of a single crystal silicon wafer, inducing by optical rectification an electric current within said thin film responsive to the pulse form radiation, conducting said electric current from said film through a pair of electrical contact elements in direct ohmic contact with said thin film, developing an electrical signal responsive to said electric current, and determining said electrical signal as a measure of characteristics of the radiation.

13. A method according to claim 9, wherein said laser radiation is $CO_2$ laser radiation.

14. A method according to claim 9, wherein said laser radiation is from Nd:YAG or any other higher power pulsed laser.

15. A method according to claim 9, wherein said thin film has a thickness of 2 to 7 $\mu$m.

16. A detection device for laser radiation comprising a thin film of tellurium semi-conductor material having a thickness of 2 to 7$\mu$m and a substantial crystallographic texture, formed on a (100) plane of a single crystal silicon substrate, said film being electrically isolated from said substrate.

17. A device according to claim 16, further including a pair of electrical contact elements in electrical contact with said film.

18. A detection device for laser radiation comprising a thin film of tellurium semi-conductor material having a thickness of about 5 $\mu$m and in the range of 2 to 7 $\mu$m and a substantial crystallographic texture, formed on a crystallographic face of a single crystal or highly crystalline silicon substrate, said film being electrically isolated from said substrate.

19. A device according to claim 15, further including a pair of electrical contact elements in electrical contact with said film.

20. An apparatus for detecting laser radiation comprising:
a thin film of tellurium semi-conductor material having a substantial crystallographic texture, said material being of non-centrosymmetric lattice structure, said thin film having a thickness of 2 to 7 $\mu$m and being supported on a single crystal silicon,
a pair of electrical contact elements in electrical contact with said film, and
means for determining an electrical signal induced in said thin film by laser radiation, said means being in electrical contact with said electrical contact elements.

21. An apparatus according to claim 20, wherein said means comprises an oscilloscope.

* * * * *